(12) United States Patent
Liu

(10) Patent No.: US 11,599,029 B2
(45) Date of Patent: Mar. 7, 2023

(54) RETICLE TRANSFER DEVICE AND EXPOSURE SYSTEM

(71) Applicant: CHANGXIN MEMORY TECHNOLOGIES, INC., Hefei (CN)

(72) Inventor: Zicheng Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/542,831

(22) Filed: Dec. 6, 2021

(65) Prior Publication Data
US 2022/0091518 A1   Mar. 24, 2022

Related U.S. Application Data

(63) Continuation of application No. PCT/CN2021/101397, filed on Jun. 22, 2021.

(30) Foreign Application Priority Data

Aug. 14, 2020   (CN) .......................... 202010815931.2

(51) Int. Cl.
G03F 7/20       (2006.01)
G03F 1/84       (2012.01)

(52) U.S. Cl.
CPC ............ *G03F 7/70741* (2013.01); *G03F 1/84* (2013.01); *G03F 7/70025* (2013.01);
(Continued)

(58) Field of Classification Search
CPC ..... B08B 5/02; G03F 1/68; G03F 1/72; G03F 1/82; G03F 1/84; G01N 21/956;
(Continued)

(56) References Cited

U.S. PATENT DOCUMENTS 4,669,875 A * 6/1987 Shiba ..................... G01N 21/94
                                                250/225
4,958,083 A * 9/1990 Sakamoto .......... G01N 21/8851
                                                250/559.11
(Continued)

FOREIGN PATENT DOCUMENTS

CN       101673046 A     3/2010
CN       105467777 A     4/2016
(Continued)

OTHER PUBLICATIONS

English translation of CN210270509, published Apr. 7, 2020. (Year: 2020).*
(Continued)

*Primary Examiner* — Christina A Riddle
(74) *Attorney, Agent, or Firm* — Cooper Legal Group, LLC

(57) ABSTRACT

Provide are a reticle transfer device and an exposure system. The reticle transfer device includes a bearing member, a light source, a light detector and a controller. The bearing member is configured to bear the reticle, and the light source is configured to emit irradiation light to the reticle and form reflected light. The light detector is configured to obtain the reflected light and generate a light detection signal. The controller is configured to determine whether particulate matter exists on a surface of the reticle based on the light detection signal. The reticle transfer device can determine whether particulate matter exists on the surface of the reticle in real time based on the light detection signal.

16 Claims, 9 Drawing Sheets

(52) U.S. Cl.
CPC ........ *G03F 7/7085* (2013.01); *G03F 7/70525* (2013.01); *G03F 7/70925* (2013.01)

(58) Field of Classification Search
CPC .... G01N 21/95676; G01N 2021/95676; G07F 7/70025; G07F 7/70525; G07F 7/70741; G07F 7/7085; G07F 7/70925; G07F 7/20; G07F 7/70691; G07F 7/70733; G07F 7/708; G07F 7/70866; G07F 7/70908–70941; G07F 7/70975; G07F 7/70991; G07F 7/70533; G07F 7/7065
USPC ...................... 355/30, 67–77; 430/5, 22, 30; 356/237.1–237.6
See application file for complete search history.

(56) References Cited

U.S. PATENT DOCUMENTS

| | | | | |
|---|---|---|---|---|
| 5,442,163 | A * | 8/1995 | Nakahara | G03F 7/70866 235/375 |
| 6,008,497 | A * | 12/1999 | Mizoguchi | B23K 26/702 250/492.1 |
| 9,513,229 | B1 * | 12/2016 | Suzuki | G03F 7/7085 |
| 2002/0176060 | A1 * | 11/2002 | Park | G03F 7/70983 355/53 |
| 2003/0184720 | A1 * | 10/2003 | Heerens | G03F 7/707 355/53 |
| 2006/0238752 | A1 * | 10/2006 | Kobayashi | G01N 21/94 356/237.2 |
| 2008/0252869 | A1 * | 10/2008 | Mori | G03F 9/7088 355/53 |
| 2013/0016346 | A1 * | 1/2013 | Romanovsky | G01N 21/9501 356/237.5 |
| 2016/0263625 | A1 | 9/2016 | Kanezawa | |
| 2020/0050118 | A1 | 2/2020 | Chang et al. | |

FOREIGN PATENT DOCUMENTS

| | | | |
|---|---|---|---|
| CN | 105717739 | A | 6/2016 |
| CN | 210270509 | U | 4/2020 |
| CN | 210573186 | U | 5/2020 |
| CN | 210835584 | U | 6/2020 |
| KR | 620160 | B1 * | 9/2006 |
| KR | 20060121562 | A | 11/2006 |
| WO | WO-2016121635 | A1 * | 8/2016 ............. B65G 49/07 |

OTHER PUBLICATIONS

English translation of WO2016/121635, published Aug. 4, 2016. (Year: 2016).*
First Office Action of the Chinese application No. 202010815931.2, dated Jun. 6, 2022, 22 pgs.

* cited by examiner

RETICLE TRANSFER DEVICE AND EXPOSURE SYSTEM

CROSS-REFERENCE TO RELATED APPLICATION

This application is a continuation application of International Patent Application No. PCT/CN2021/101397, filed on Jun. 22, 2021, which claims priority to Chinese Patent Application No. 202010815931.2, filed on Aug. 14, 2020 and entitled "Reticle Transfer Device and Exposure System". The disclosures of International Patent Application No. PCT/CN2021/101397 and Chinese Patent Application No. 202010815931.2 are incorporated by reference herein in their entireties.

TECHNICAL FIELD

The embodiment of the present disclosure relates to a reticle transfer device and an exposure system.

BACKGROUND

Photoetching is a critical step in the manufacturing process of semiconductor apparatuses such as a Dynamic Random Access Memory (DRAM). In the photoetching process, the cleanliness of a reticle is an important factor for ensuring the quality of photoetching.

SUMMARY

According to the embodiments of the present disclosure, the first aspect of the present disclosure provides a reticle transfer device configured to convey a reticle between different components. The reticle transfer device includes: a bearing member, a light source, a light detector and a controller.

The bearing member is configured to bear the reticle.

The light source is arranged on, a side for bearing the reticle, of the bearing member, to emit irradiation light to the reticle. The reflected light is formed when the irradiation light irradiates the reticle.

The light detector is configured to obtain the reflected light and generate a light detection signal based on the reflected light.

The controller is electrically connected to the light detector and configured to determine whether particulate matter exists on a surface of the reticle based on the light detection signal.

According to the embodiments of the present disclosure, the second aspect of the present disclosure provides an exposure system including a plurality of components and a plurality of reticle transfer devices as described above, and the reticle transfer devices are configured to convey at least one reticle between different components.

Details of one or more embodiments of the present disclosure will be proposed in the following drawings and descriptions. Other features and advantages of the present disclosure will become apparent from the description, the accompanying drawings and the claims.

BRIEF DESCRIPTION OF THE DRAWINGS

In order to more clearly illustrate the technical schemes of the embodiments of the present disclosure or the existing technology, Traditional following briefly introduces the accompanying drawings required for describing the embodiments or the existing technology. Apparently, the accompanying drawings in the following description show only some embodiments of the present disclosure, and a person of ordinary skill in the art may still derive other drawings from these accompanying drawings without creative efforts.

DETAILED DESCRIPTION

Figure 1:
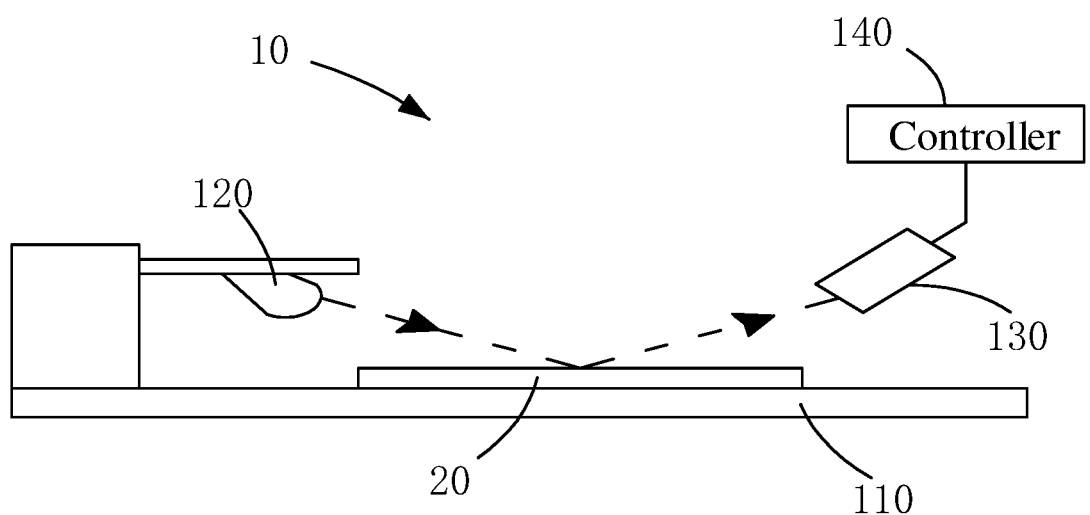
FIG. 1 is schematic view of a reticle transfer device according to an embodiment of the present disclosure.

In the related technologies, an Integrated Reticle Inspection System (IRIS) is generally used to detect whether particulate matter exists on a surface of a reticle However, when the IRIS is used for detecting whether particulate matter exists on the surface of the reticle, it is difficult to determine the source of the particulate matter on the surface of the reticle.

To further clarify the above objectives, features and advantages of the present disclosure, the specific embodiments of the present disclosure are described in detail below with reference to the accompanying drawings. In the following description, numerous specific details are set forth in order to provide a thorough understanding of the present disclosure. However, the present disclosure can be implemented in a number of other ways different from those described herein, those skilled in the field can make similar improvements without violating the connotation of the present disclosure, and therefore the present disclosure is not limited to the specific embodiments disclosed below.

Sequence numbers for components herein, such as "first," "second," etc., are used solely to distinguish the described objects and do not have any ordinal or technical meaning. The terms "connection" and "linkage" in the present disclosure, unless otherwise stated, include both direct and indirect connections (linkage). In the description of the present invention, it is to be understood that the terms "upper," "lower," "front," "rear," "left," "right," "vertical," "horizontal," "top," "bottom," "inner," "outer," "clockwise," "counterclockwise," and the like indicate orientation or positional relationships based on the orientation or positional relationships shown in the accompanying drawings, for ease of description of the present disclosure and simplification of description only, rather than indicating or implying that the device or elements referred to must have a specific orientation or be configured and operated in specific ways, and therefore cannot be understood as limiting the present disclosure.

In the present disclosure, unless otherwise clearly specified and defined, the first feature "above" or "below" the second feature may be direct contact between the first feature and the second feature, or indirect contact between the first feature and the second feature through an intermediate. In addition, a situation that the first feature is "on", "above" and "on the upside of" the second feature may be that the first feature is right above or obliquely above the second feature, or only represents that the horizontal height of the first feature is greater than that of the second feature. A situation that the first feature is "under", "below" and "underneath" the second feature may be that the first feature is right below and in the oblique below the second feature, or only represents that the horizontal height of the first feature is less than that of the second feature.

In a photoetching process, a reticle is required to be conveyed between different components of an exposure system by a reticle transfer device. The disclosure provides a reticle transfer device and an exposure system. The exposure system includes the reticle transfer device. The reticle transfer device according to the present disclosure can determine whether particulate matter exists on the surface of the reticle. Therefore, in the exposure system using the reticle transfer device, when particulate matter is generated on the surface of the reticle, the particulate matter can be detected in time and the source of the particulate matter on the surface of the reticle can be accurately determined, so that the time of excluding the source of the particulate matter is shortened, engineering personnel can conveniently clean related components in time, and the manufacturing capacity of a semiconductor apparatus is improved.

In embodiments of the present disclosure, the connection manner between two elements includes a fixed connection or a movable connection. The fixed connection herein means that the two elements are connected by a mortise and tenon, by a buckle or by solid glue, so that the two connected elements are kept relatively fixed in position relation. The movable connection herein means that the two elements are connected by nesting or a hinge or the like, so that the two connected elements can displace relative to one another within a certain range. When the elements are electrical elements, the two electrical elements can also be electrically connected. The electrical connection herein refers to that the connection between two electrical elements is achieved through a wire so as to realize the transmission of an electrical signal.

As shown in FIG. 1, the present disclosure provides a reticle transfer device 10 configured to convey a reticle 20 between different components. The reticle transfer device 10 includes a bearing member 110, a light source 120, a light detector 130, and a controller 140.

Specifically, the bearing member 110 refers to a device for bearing the reticle 20 when the reticle transfer device 10 conveys the reticle 20 between different components. The bearing member 110 may be a flat plate for bearing the reticle 20. The bearing member 110 may have two surfaces opposite to each other. One of the two opposite surfaces is configured to bear the reticle 20.

The light source 120 is arranged on one side of the bearing member 110, that is configured to bear the reticle 20, and the light source is configured to emit irradiation light to the reticle 20. A reflected light is formed when the irradiation light is irradiated on the reticle 20. The light source 120 refers to a device capable of emitting light. When the reticle 20 is placed on one surface of the bearing member 110, the light source 120 may be arranged on, a side away from the bearing member 110, of the reticle 20. Therefore, the surface away from the bearing member 110 of the reticle 20 can be irradiated by the light emitted from the light source 120. After the light emitted from the light source 120 is irradiated onto the reticle 20, the light is reflected by the reticle. In various embodiments of the present disclosure, for convenience of description, the light emitted from the light source 120 and irradiated onto the surface of the reticle 20 is referred to as irradiation light. In addition, the reflection formed when the irradiation light is irradiated onto the reticle 20 is referred to as reflected light.

The light detector 130 is configured to obtain the reflected light and generate a light detection signal based on the reflected light. The light detector 130 herein may be an optical-to-electrical converter. The optical-to-electrical converter refers to a device which can convert an optical signal into an electrical signal. An electric signal generated by the light detector 130 based on the reflected light is referred to as a light detection signal here.

The controller 140 is electrically connected to the light detector 130 to determine whether particulate matter exists on the surface of the reticle 20 based on the detection signal. The controller 140 here may be a Micro Controller Unit (MCU). The controller 140 is electrically connected to the light detector 130. After the light detector 130 generates the light detection signal based on the reflected light, the light detection signal may be transmitted to the controller 140. Then, the controller 140 may determine whether particulate matter exists on the surface of the reticle 20 based on the light detection signal.

More specifically, the work flow of the reticle transfer device 10 of the present disclosure is as follows. The light source 120 emits irradiation light to the reticle 20 when the reticle 20 is placed on the bearing member 110. The irradiation light will form reflected light when it is irradiated onto the surface of the reticle 20. The light detector 130 is configured to obtain the reflected light and generate the light detection signal. After the light detection signal generated by the light detector 130 is transmitted to the controller 140, the controller 140 can determine whether particulate matter exists on the surface of the reticle 20 based on the light detection signal. When the reticle transfer device 10 of the present disclosure is applied to an exposure system 30, the reticle transfer device 10 may convey the reticle 20 between two components. When the reticle transfer device 10 detects that particulate matter exists on the surface of the reticle 20, it is indicated that the particulate matter originating from the component from which the reticle transfer device 10 receives the reticle 20. The reticle transfer device 10 can accurately determine the source of particulate matter on the surface of the reticle 20, so that the time of excluding the source of the particulate matter is shortened, engineering personnel can conveniently clean related components in time, and the manufacturing capacity of a semiconductor apparatus is improved.

In one embodiment, the controller 140 determines whether particulate matter exists on the surface of the reticle 20 based on the light detection signal. In this embodiment, the controller 140 obtains the actual intensity of the reflected light based on the light detection signal, and determines whether particulate matter exists on the surface of the reticle 20 based on the actual intensity of the reflected light.

Specifically, if particulate matter exists on the surface of the reticle 20, the particulate matter has an influence on the intensity of the reflected light when the irradiation light is irradiated on the particulate matter. The standard intensity of the reflected light may be stored beforehand in the controller 140. After the light detector 130 obtains the reflected light and generates the light detection signal, the light detection signal is transmitted to the controller 140. Then, the controller 140 may obtain the actual intensity of the reflected light based on the light detection signal. If the actual intensity of the reflected light is different from the standard intensity of the reflected light, it means that particulate matter exists on the surface of the reticle 20.

In another embodiment, the reticle transfer device 10 of the present disclosure may further include a power source which powers the light source 120, and a switching device electrically connected between the power source and the light source 120. The switching device is electrically connected between the power source and the light source 120 to control on-off of a circuit between the power source and the light source 120. The switching device may be electrically connected to the controller 140, so that the controller 140 may control the opening or closing of the switching device.

In this embodiment, the controller 140 determines whether particulate matter exists on the surface of the reticle 20 based on the light detection signal. In another example, the controller 140 obtains the propagation time of the irradiation light and the reflected light based on the light detection signal, and then determines whether particulate matter exists on the surface of the reticle 20 based on the propagation time.

Specifically, if particulate matter exists on the surface of the reticle 20, the particulate matter has an influence on a propagation path of the irradiation light and the reflected light and also has an influence on the propagation time of the irradiation light and the reflected light when the irradiation light is irradiated on the particulate matter. A standard time of light propagation may be stored beforehand in the controller 140. After the light detector 130 obtains the reflected light and generates a light detection signal, the light detection signal is transmitted to the controller 140. Then, the controller 140 may obtain the actual propagation time of light based on the light detection signal. The actual time of the light propagation may be a duration from the closing of switching device controlled by the controller 140 until the light detector 130 may detect a stable intensity of the reflected light. If the actual propagation time of the light is different from the standard propagation time of the light, it means that the particulate matter exists on the surface of the reticle 20.

The above description only describes the working principle of the reticle transfer device 10 of the present disclosure by two possible embodiments. In actual application, the controller 140 of the reticle transfer device 10 of the present disclosure may also determine the existence of particulate matter on the surface of the reticle 20 in other ways based on the light detection signal. The concept of the present disclosure lies in that the reticle transfer device 10 can determine whether particulate matter exists on the surface of the reticle 20 in real time based on the light detection signal, and therefore it is possible to accurately determine the component from which the particulate matter comes. Thus, the embodiments which do not go beyond the concept of the present disclosure should be understood as being within the scope of the present disclosure.

Figure 2:
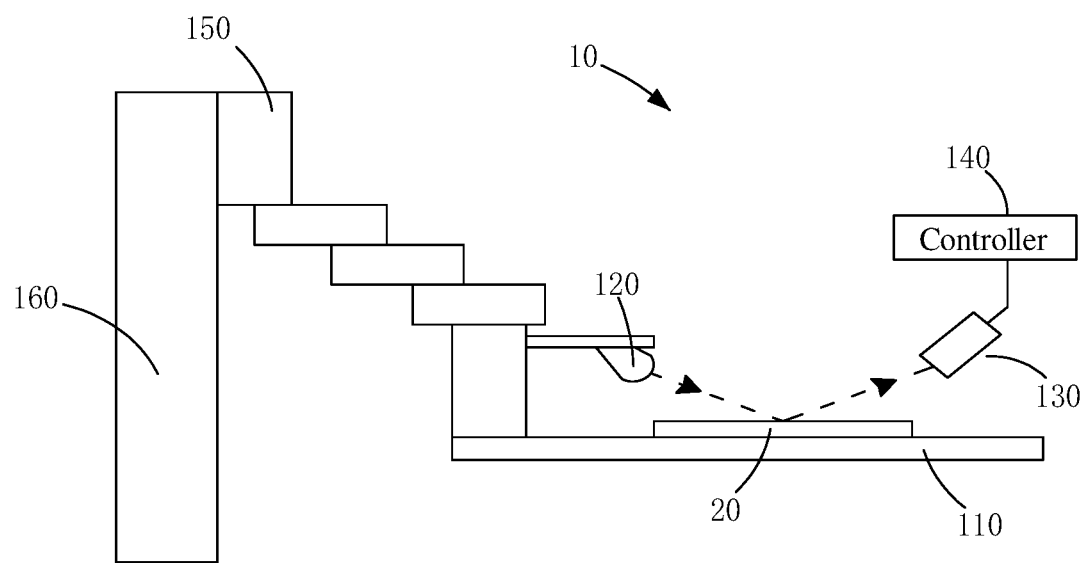
FIG. 2 is a schematic view of a reticle transfer device according to another embodiment of the present disclosure.

In one embodiment, as shown in FIG. 2, the reticle transfer device 10 of the present disclosure further includes a mechanical member 150.

Specifically, the mechanical member 150 and the bearing member 110 may constitute a mechanical arm. An end part of one end of the mechanical member 150 may be fixed to a base 160, and an end part of the other end of the mechanical member 150 may be connected to the bearing member 110. After the reticle 20 is carried on the bearing member 110, the mechanical member 150 telescopically extends and/or rotates along a preset path, so that the reticle 20 is conveyed between different components. In this embodiment, as shown in FIG. 2, the light source 120 may be connected to the mechanical member 150 of the reticle transfer device 10 in such a way that the light source 120 is located on, a side away from the bearing member 110, of the reticle 20.

Figure 3:
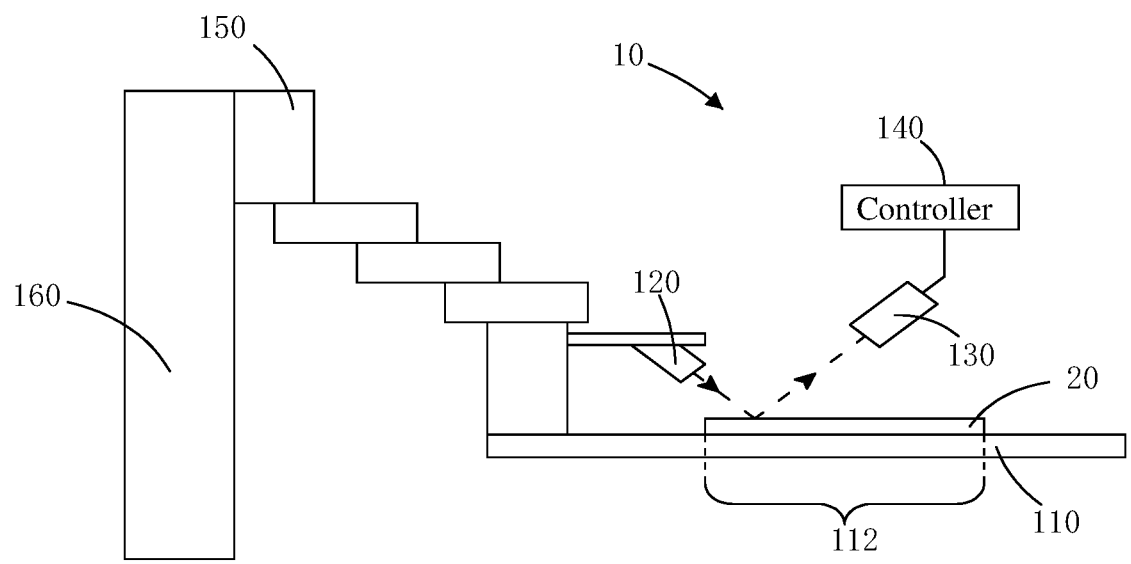
FIG. 3 is a schematic view of a reticle transfer device according to yet another embodiment of the present disclosure.

In one embodiment, as shown in FIG. 3, the bearing member 110 has a first area 112 for bearing the reticle 20. An orthographic projection of the light source 120 on the bearing member 110 is located outside of the first area 112.

Specifically, the bearing member 110 may have the first area 112 for bearing the reticle 20. When the reticle 20 is placed on the bearing member 110, the reticle 20 may be located within the first area 112. In this embodiment, a boundary size of the first area 112 is the same as that of the reticle 20, so that when placed on the bearing member 110, the reticle 20 is located just within the first area 112. The boundary of the first area 112 may also be larger than the boundary of the reticle 20. The bearing member 110 may be horizontally arranged. The orthographic projection of the light source 120 on the bearing member 110 refers to the projection of the light source 120 on the bearing member 110 in a gravity direction. In other word, the orthographic projection of the light source 120 on the bearing member 110 refers to the projection of the light source 120 on the bearing member 110 in a direction perpendicular to a direction of a plane in which the bearing member 110 is located.

In this embodiment, the projection of the light source 120 on the bearing member 110 may be located outside of the first area 112. That is, the projection of the light source 120 on the bearing member 110 is located on one side of the first area 112. Therefore, the irradiation light emitted from the light source 120 can be irradiated to any area on the surface of the reticle 20, and the reflected light formed by the irradiation light is located on the same side as the irradiation light. In this embodiment, the irradiation light can be irradiated to any area on the surface of the reticle 20, and the detection capability of the reticle transfer device 10 of the present disclosure on particulate matter can be improved. The formed reflected light is located on the same side as the irradiation light to facilitate the light detector 130 to obtain the reflected light.

Further, the boundary size of the first area 112 is the same as that of the reticle 20. The orthographic projection of the light source 120 on the bearing member 110 adjoins an edge of the first area 112.

Specifically, the boundary size of the first area 112 is the same as that of the reticle 20, that is, when the reticle 20 is carried on the bearing member 110, the reticle 20 is located inside the first area 112. In this case, the orthographic projection of the light source 120 on the bearing member 110 adjoins the edge of the first area 112, that is, the orthographic projection of the light source 120 on the bearing member 110 is adjacent to the orthographic projection of the reticle 20 on the bearing member 110. The orthographic projection of the light source 120 on the bearing member 110 is adjacent to the orthographic projection of the reticle 20 on the bearing member 110, so that the irradiation light can be irradiated to any area of the surface of the reticle 20 without being irradiated to an area apart from the reticle 20. In this way, an adverse impact on the determination of whether particulate matter exists on the surface of the reticle 20 by the controller 140 based on the light detection signal can be avoided.

Figure 4:
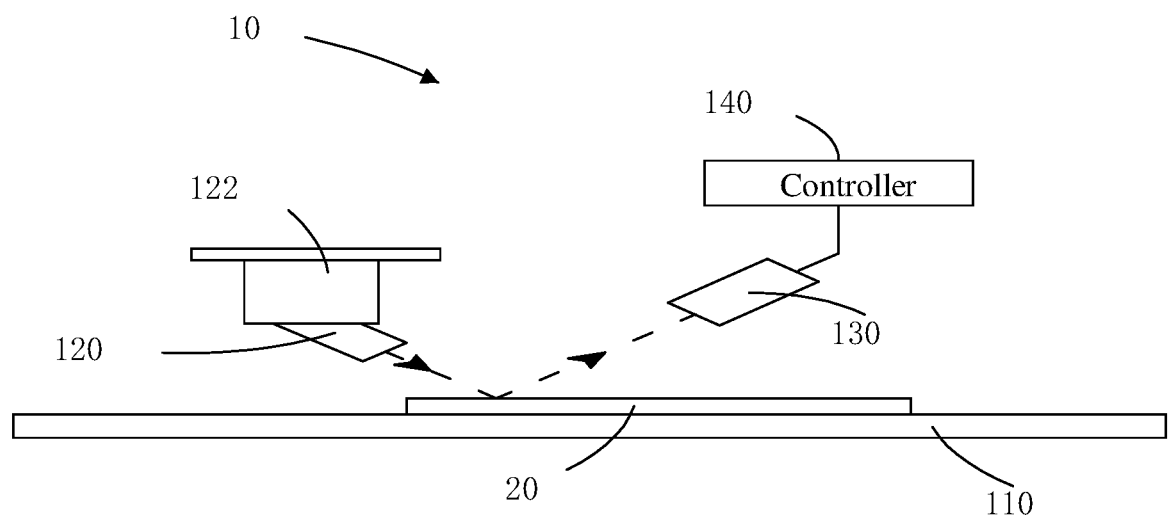
FIG. 4 is schematic view of a reticle transfer device according to yet another embodiment of the present disclosure.

In one embodiment, as shown in FIG. 4, the irradiation light may be a parallel light beam.

Specifically, the irradiation light may be a parallel light beam. The parallel light beam is also called directional light, referring to a light beam which does not diffuse as the light propagates. In the case that the irradiation light is the parallel beam, the light source 120 may be a searchlight or a laser transmitter or the like here.

Further, in the case that the irradiation light is a parallel light beam, the reticle transfer device 10 may further include an actuator 122. The actuator 122 may be connected to the light source 120, and configured to actuate the light source 120 to move a light spot formed on the reticle 20 by the irradiation light along a preset path. The preset path covers the reticle 20.

Specifically, in the case that the irradiation light is the parallel light beam, it is difficult for the light spot formed on the reticle 20 by the irradiation light to completely cover the reticle 20 since the light spot is limited by the diameter of the irradiation light. Thus, the actuator 122 connected to the light source 120 for actuating the light source 120 may be provided. The actuator 122 may actuate the light source 120 to move and/or rotate, to move the light spot formed on the reticle 20 by the irradiation light along a certain preset path. The preset path covers the reticle 20, so that the irradiation light in the form of the parallel light beam can also detect the whole reticle 20, so as to detect whether particulate matter exists on the surface of the reticle 20.

Further, the actuator 122 may be coupled to the controller 140, so that the controller 140 may control the actuator 122. A control program may be preset in the controller 140. In operation, the controller 140 may control the actuator 122 based on the preset control program, to control the actuator 122 to actuate the light source 120 to move and/or rotate.

Figure 5:
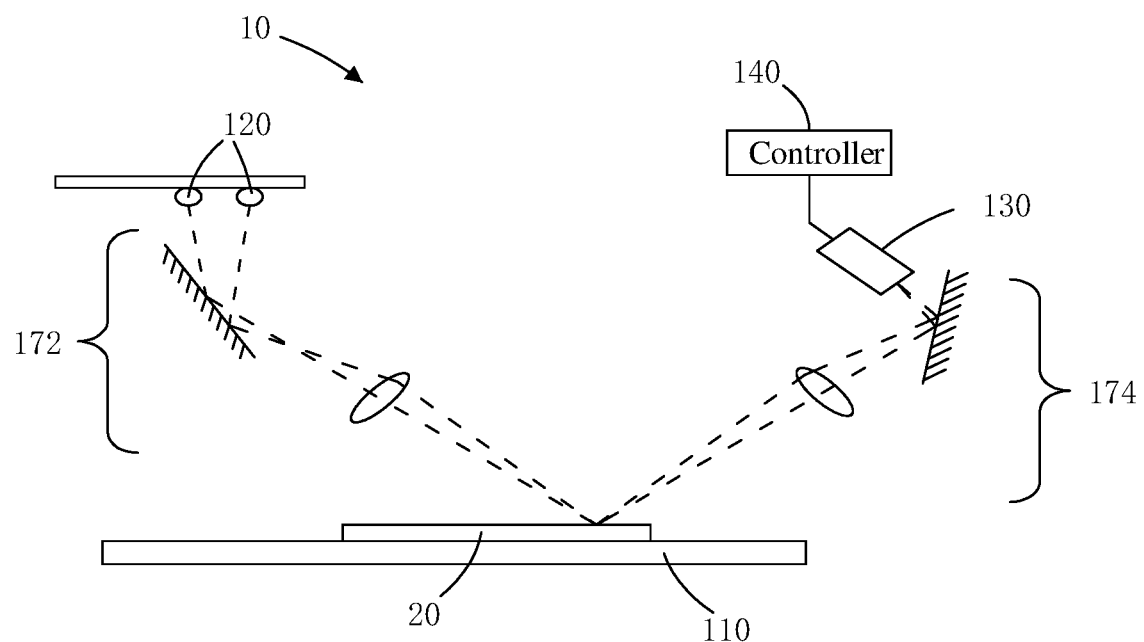
FIG. 5 is schematic view of a reticle transfer device according to yet another embodiment of the present disclosure.

In another embodiment, as shown in FIG. 5, in the case that the irradiation light emitted by the light source 120 is a parallel light beam, the reticle transfer device 10 of the present disclosure may also include two or more light sources 120. The spots of the irradiation light emitted by the two or more light sources 120 coincide with one another to form one coinciding light spot on the surface of reticle 20. The reticle transfer device 10 may include a first optical assembly 172 and a second optical assembly 174.

Specifically, in the case that the irradiation light emitted by the light source 120 is the parallel light beam and the reticle transfer device 10 includes two or more light sources 120, if the two or more light sources 120 form two or more light spots on the reticle 20, it has an influence on the controller 140 in terms of determining whether particulate matter exists on the surface of the reticle 20 based on the light detection signal. Thus, the two or more light sources 120 need to form one coinciding light spot on the surface of the reticle 20, and the reflected light formed by the irradiation light of both of the two light sources 120 is obtained by the light detector 130.

In this embodiment, the reticle transfer device 10 may be provided with the first optical assembly 172 and the second optical assembly 174. The first optical assembly 172 is located in a light path of the irradiation light, and may include at least one of a reflecting mirror and a refractor. The first optical assembly 172 is configured to change the light path of the irradiation light in such a way that the two or more light sources 120 form one coinciding light spot on the surface of the reticle 20. The second optical assembly 174 is located in the light path of the reflected light, and may include at least one of a reflecting mirror and a refractor. The second optical assembly 174 is configured to change the light path of the reflected light in such a way that the reflected light formed by the irradiation light of all of the light sources 120 is obtained by the light detector 130.

Figure 6:
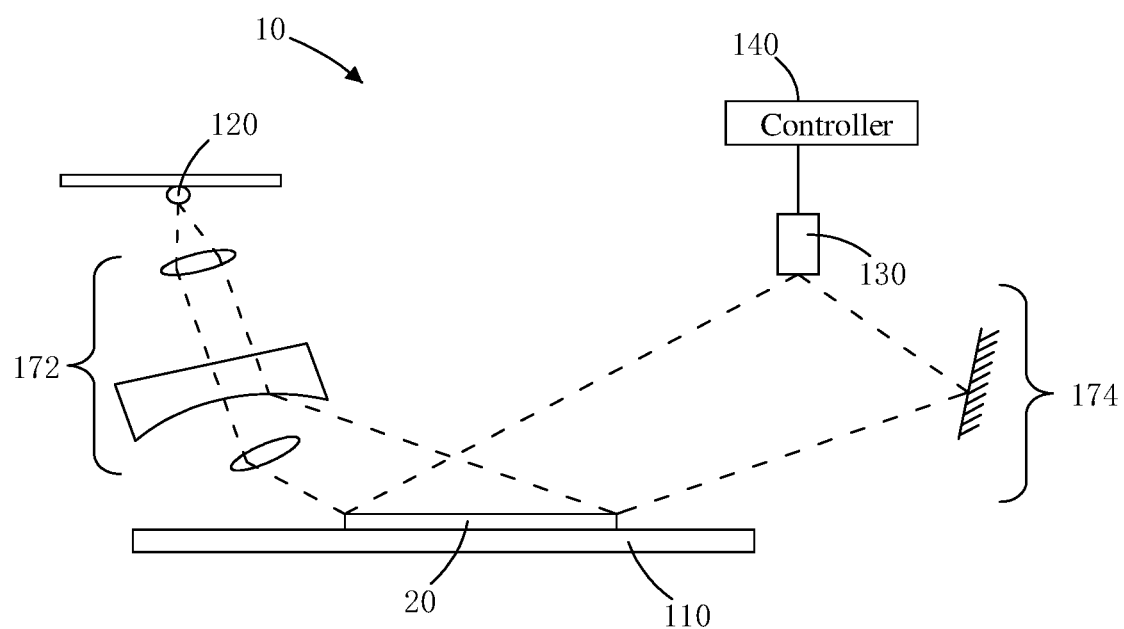
FIG. 6 is schematic view of a reticle transfer device according to yet another embodiment of the present disclosure.

In one embodiment, as shown in FIG. 6, the irradiation light may be a focused light beam.

Specifically, the irradiation light may be the focused light beam. The focused light beam refers to a light beam which may diffuse as the light propagates. In the case that the irradiation light is the focused light beam, the light source 120 may be a bulb and the like.

Further, in the case that the irradiation light is the focused light beam, the reticle transfer device 10 of the present disclosure may further include a first optical assembly 172 and a second optical assembly 174.

Specifically, in the case that the irradiation light is the focused light beam, the irradiation light may also be irradiated to an area in addition to the reticle 20 when covering the reticle 20. If the irradiation light is irradiated to the area in addition to the reticle 20, it has an influence on the controller 140 in term of determine whether particulate matter exists on the surface of the reticle 20 based on the light detection signal. Thus, in this embodiment, the reticle transfer device 10 may be provided with the first optical assembly 172 and the second optical assembly 174. The first optical assembly 172 is located in the light path of the irradiation light, and may include at least one of the reflecting mirror and the refractor. The first optical assembly 172 is configured to change the light path of the irradiation light in such a way that the irradiation light emitted by the light source 120 is completely irradiated onto the surface of the reticle 20, and completely covers the surface of the reticle 20. The second optical assembly 174 is located in the light path of the reflected light, and may include at least one of a reflecting mirror and a refractor. The second optical assembly 174 is configured to change the light path of the reflected light in such a way that the reflected light formed by the irradiation light of the light source 120 is obtained by the light detector 130. That is, the second optical assembly 174 is configured to converge the reflected light at the light detector 130.

Figure 7:
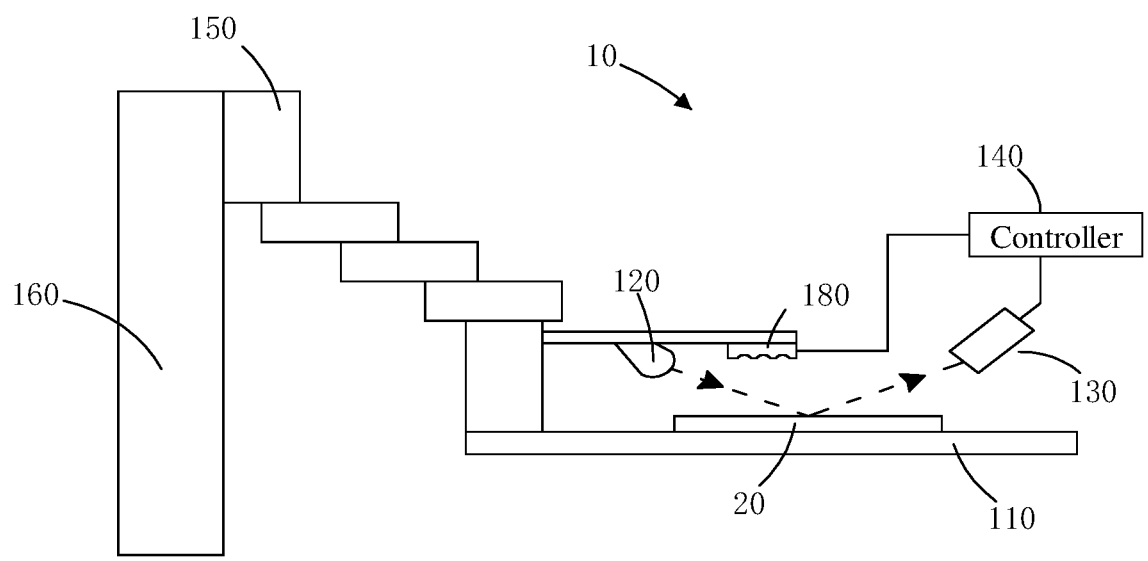
FIG. 7 is schematic view of a reticle transfer device according to yet another embodiment of the present disclosure.

In one embodiment, as shown in FIG. 7, the reticle transfer device 10 of the present invention may further include a purging member 180. The purging member 180 may be arranged on, a side for bearing the reticle 20, of the bearing member 110. The purging member 180 may be electrically connected to the controller 140 and controlled by the controller 140.

Specifically, the purging member 180 is located on, a side away from the purging member 180, of the reticle 20, namely located on the side of the bearing member 110 for bearing the reticle 20. In operation, the purging member 180 can remove particulate matter on a surface of the reticle 20 away from the bearing member 110 by gas blowing. The purging member 180 may also be connected to the mechanical member 150 of the reticle transfer device 10. The purging member 180 may be electrically connected to the controller 140. The controller 140 controls the purging member 180 to start work when the controller determines that particulate matter exists on the surface of the reticle 20.

In one embodiment, electrical connection between any two electronic elements of the reticle transfer device 10 of the present invention is realized by a wire. That is, the two electronic elements can be connected through the wire to allow an electrical signal to be transmitted between the two electronic apparatuses. A diameter of the wire connected between the two electronic apparatuses may be smaller than or equal to 2 mm, to improve the integration degree of the reticle transfer device 10.

Figure 8:
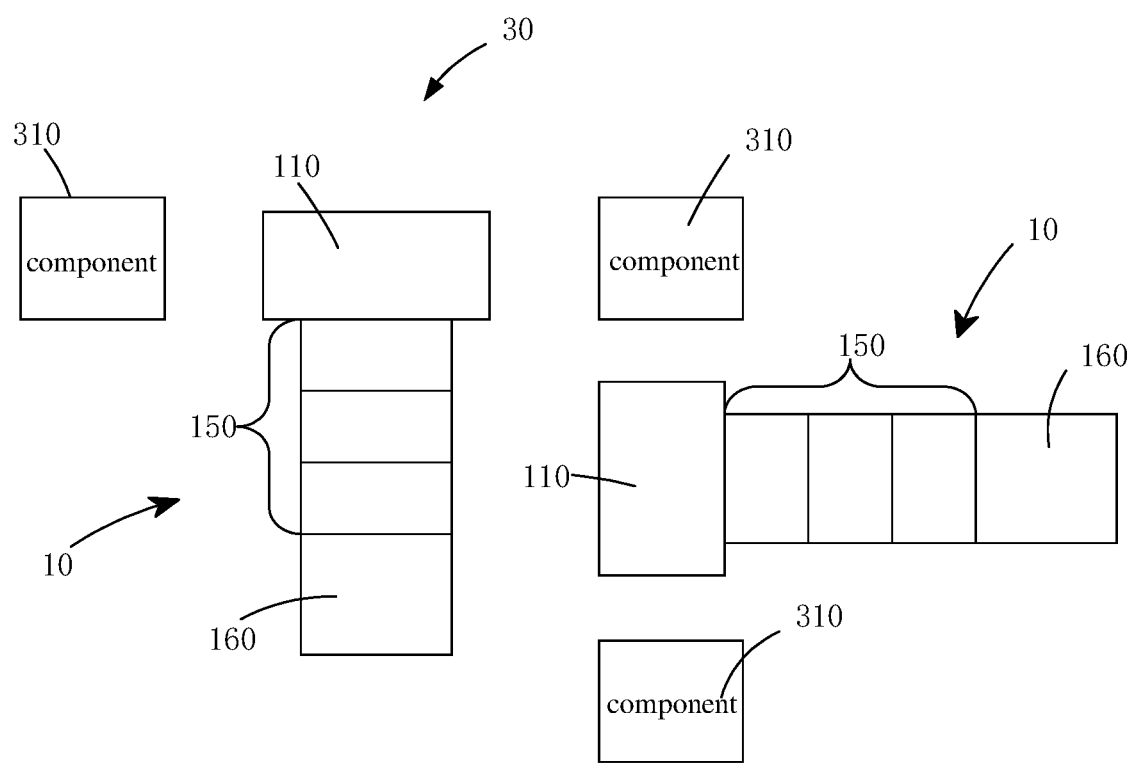
FIG. 8 is a schematic view of an exposure system according to an embodiment of the present disclosure.

In one embodiment, as shown in FIG. 8, the present disclosure also provides an exposure system 30 including a plurality of components 310 and a plurality of reticle transfer devices 10 according to any one of the embodiments described above. The reticle transfer devices 10 are configured to shift at least one reticle 20 between different components 310.

Specifically, the exposure system 30 may include at least two components 310. The expression "at least two" herein may refer to two or more. The components 310 herein refer to devices of the exposure system 30 in addition to the reticle transfer device 10, which may make contact with the reticle 20 or receive the reticle 20. For example, the component 310 may be a loading port component allowing the reticle 20 to enter the photoetching machine from outside, a temporary storage component for temporarily storing the reticle 20, an Integrated Reticle Inspection System (IRIS) for detecting particulate matter, a reticle bearing plate component used in exposure of the reticle 20, etc.

The exposure system 30 further includes at least one reticle transfer device 10. The expression "at least one" herein may refer to one or more. In the exposure system 30, the number of the reticle transfer device 10 and that of the component 310 may be the same or different. The reticle transfer device 10 is configured to convey the reticle 20 between different components 310. The reticle transfer device 10 may include a bearing member 110, a light source 120, a light detector 130 and a controller 140. The bearing member 110 is configured to bear the reticle 20. The light source 120 is arranged on, a side for bearing the reticle 20, of the bearing member 110, to emit irradiation light to the reticle 20. Reflected light is formed when the irradiation light is irradiated onto the reticle 20. The light detector 130 is configured to obtain the reflected light and generate a light detection signal based on the reflected light. The controller 140 is electrically connected to the light detector 130 and configured to determine whether particulate matter exists on a surface of the reticle 20 based on the light detection signal.

Figure 9:
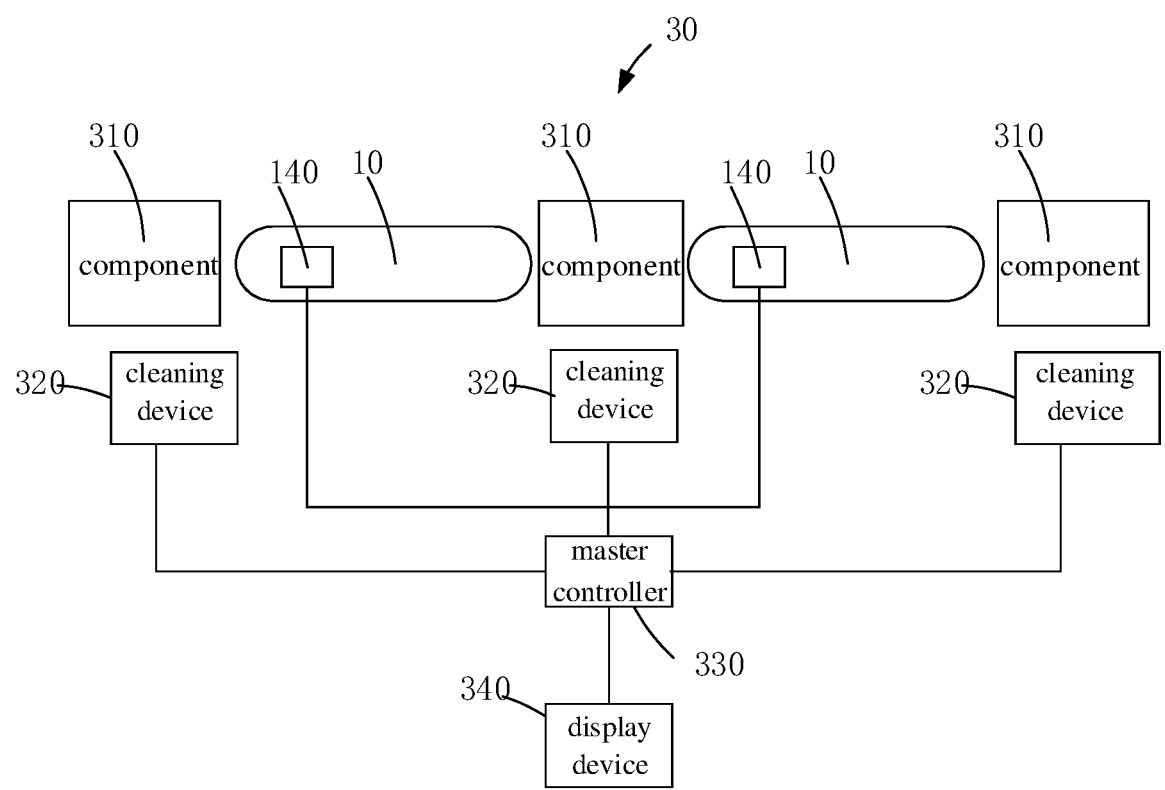
FIG. 9 is a schematic view of an exposure system according to another embodiment of the present disclosure.

In one embodiment, as shown in FIG. 9, the exposure system 30 of the present disclosure further includes a cleaning device 320 and a master controller 330.

Specifically, the cleaning device 320 is configured to clean a component 310. The cleaning device 320 may be a gas cleaning device 320 for purging the component 310 by blowing gas thereto. The number of the cleaning device 320 may be the same as that of the component 310, so that each component 310 has one cleaning device 320 configured to clean this component 310.

The master controller 330 is electrically connected to controller 140 of each of the plurality of reticle transfer devices 10. When the controllers 140 determine that particulate matter exists on the surface of the reticle 20, this result is transmitted to the master controller 330. The master controller 330 is further connected to the cleaning device 320 to control the cleaning device 320 to start work.

In this embodiment, the master controller 330 is configured to control the cleaning device 320 to clean a component 310 to be cleaned responsive to determining, by the controller 140, that particulate matter exists on a surface of the reticle 20. The component 310 to be cleaned refers to a last component 310 along a shift path of the reticle 20 when it is determined that particulate matter exists on the surface of the reticle 20. In other words, when the reticle 20 needs to be conveyed from a component A to a component B and conveyed from the component B to a component C, if a controller 140 determines, in the process of conveying the reticle from the component B to the component C, that particulate matter exists on the surface of the reticle 20, the component B is the component 310 to be cleaned. At this time, the master controller 330 may control the cleaning device 320 to start work according to the determination of the controllers 140 so as to clean the component B.

It should be noted that in the working process of the exposure system 30, the conveying process of the reticle 20 generally includes a loading process and an unloading process. The loading process refers to a process during which the reticle 20 is conveyed from the loading port component 310 to the reticle bearing plate component 310. The unloading process is the inverse of the loading process. Thus, if the same reticle transfer device 10 detects, in different conveying processes of the reticle 20, the existence of particulate matter on the surface of the reticle 20, the components 310 to be cleaned are also different.

In one embodiment, the exposure system 30 of the present disclosure may include a photoetching machine. The reticle transfer devices 10 are configured to convey the at least one reticle 20 in the photoetching machine.

In one embodiment, still as shown in FIG. 9, the exposure system 30 of the present disclosure may further include a display device 340.

Specifically, the display device 340 may be electrically connected to the master controller 330. When the controller 140 determines that particulate matter exists on the surface of the reticle 20, the controllers 140 may transmit this result to the master controller 330. When obtaining the result, the master controller 330 can control the display device 340 to emit an alarm, and display a conveying path of the reticle 20 through the display device 340. Engineering personnel can rapidly determine the source of the particulate matter through the conveying path, corresponding components are cleaned in time, and the manufacturing capacity of a semiconductor apparatus is improved.

The above exposure system 30 includes a plurality of components 310 and reticle transfer devices 10 in the above embodiments. When the reticle 20 is conveyed between the different components 310 through the reticle transfer devices 10, if particulate matter appears on the surface of the reticle 20, the component 310, from which the particulate matter comes, can be accurately determined. The reticle transfer device 10 can accurately determine the component 310 from which the particulate matter on the surface of the reticle 20 comes, so that time for excluding the source of the particulate matter is shortened, engineering personnel can conveniently clean related components in time, and the manufacturing capacity of a semiconductor apparatus is improved.

The technical features of the above embodiments can be combined arbitrarily. In order to make the description concise, all possible combinations of various technical features in the above embodiments are not completely described. However, as long as there is no contradiction in the combination of these technical features, it should be regarded as the scope of this specification.

The foregoing embodiments only describe several implementations of the present disclosure, and their description is specific and detailed, but cannot therefore be understood as a limitation to the patent scope of the present disclosure. It should be noted that those of ordinary skill in the art may further make variations and improvements without departing from the conception of the present disclosure, and these all fall within the protection scope of the present disclosure.

Therefore, the patent protection scope of the present disclosure should be subject to the appended claims.

What is claimed is:

1. A reticle transfer device, configured to convey a reticle between different components, and comprising:
    a bearing member, configured to bear the reticle;
    a light source, the light source being arranged on, a side for bearing the reticle, of the bearing member, to emit an irradiation light to the reticle, wherein a reflected light is formed when the irradiation light is irradiated onto the reticle;
    a light detector, configured to obtain the reflected light and generate a light detection signal based on the reflected light; and
    a controller, electrically connected to the light detector and configured to determine whether particulate matter exists on a surface of the reticle based on the light detection signal,
    wherein the reticle transfer device further comprises a base and a mechanical member, an end part of one end of the mechanical member being fixed to the base, an end part of the other end of the mechanical member being connected to the bearing member, the mechanical member and the bearing member together forming a mechanical arm, the mechanical member being configured to move along a first preset path to convey the reticle between the different components, the light source being connected to the mechanical member.

2. The reticle transfer device of claim 1, wherein the bearing member has a first area for bearing the reticle, and an orthographic projection of the light source on the bearing member is located outside of the first area.

3. The reticle transfer device of claim 2, wherein the orthographic projection of the light source on the bearing member adjoins an edge of the first area.

4. The reticle transfer device of claim 2, wherein a boundary size of the first area is the same as that of the reticle.

5. The reticle transfer device of claim 1, wherein the irradiation light is a parallel light beam.

6. The reticle transfer device of claim 5, further comprising:
    an actuator, connected to the light source, the actuator being configured to actuate the light source to move a light spot formed by the irradiation light on the reticle along a second preset path, wherein the second preset path covers the reticle.

7. The reticle transfer device of claim 1, wherein the irradiation light is a focused light beam.

8. The reticle transfer device of claim 7, further comprising:
    a first optical assembly, located in a light path of the irradiation light, wherein the first optical assembly comprises at least one of a reflecting mirror or and a refractor to direct all of the irradiation light to the surface of the reticle; and
    a second optical assembly, located in a light path of the reflected light, wherein the second optical assembly comprises at least one of a reflecting mirror or a refractor to converge the reflected light at the light detector.

9. The reticle transfer device of claim 1, further comprising a purging member arranged on, the side for bearing the reticle, of the bearing member, wherein the purging member is electrically connected to the controller so as to be controlled by the controller, and the purging member is configured to remove the particulate matter from the reticle by gas blowing responsive to determining that the particulate matter exists on the surface of the reticle.

10. The reticle transfer device of claim 1, wherein the controller is configured to obtain an actual intensity of the reflected light based on the light detection signal and determine whether particulate matter exists on the surface of the reticle based on the actual intensity of the reflected light.

11. The reticle transfer device of claim 1, wherein the controller is configured to obtain a propagation time of the irradiation light and a propagation time of the reflected light based on the light detection signal, and determine whether particulate matter exists on the surface of the reticle based on the propagation time.

12. The reticle transfer device of claim 1, further comprising a power source for powering the light source, and a switching device electrically connected between the power source and the light source.

13. An exposure system, comprising a plurality of components and a plurality of reticle transfer devices configured to convey at least one reticle between different components,
    wherein each of the reticle transfer devices comprises:
    a bearing member, configured to bear a reticle;
    a light source, the light source being arranged on, a side for bearing the reticle, of the bearing member, to emit an irradiation light to the reticle, wherein a reflected light is formed when the irradiation light is irradiated onto the reticle;
    a light detector, configured to obtain the reflected light and generate a light detection signal based on the reflected light; and
    a controller, electrically connected to the light detector and configured to determine whether particulate matter exists on a surface of the reticle based on the light detection signal,.
    wherein the reticle transfer device further comprises a base and a mechanical member, an end part of one end of the mechanical member being fixed to the base, an end part of the other end of the mechanical member being connected to the bearing member, the mechanical member and the bearing member together forming a mechanical arm, the mechanical member being configured to move along a preset path to convey the reticle between the different components, the light source being connected to the mechanical member.

14. The exposure system of claim 13, further comprising:
    a cleaning device, configured to clean the components; and
    a master controller, electrically connected to the controller of each of the reticle transfer devices, and connected to the cleaning device, wherein the master controller is configured to control the cleaning device to clean a component to be cleaned responsive to determining, by the controller, that the particulate matter exists on the surface of the reticle, wherein the component to be cleaned refers to a last component along a transfer path of the reticle when it is determined that the particulate matter exists on the surface of the reticle.

15. The exposure system of claim 13, further comprising a photoetching machine, wherein the reticle transfer devices are configured to convey the at least one reticle in the photoetching machine.

16. The exposure system of claim 15, further comprising a display device, wherein the display device is electrically connected to a master controller, the master controller controls the display device to emit an alarm and display a transfer path of the reticle responsive to determining, by the controller, that the particulate matter exists on the surface of the reticle.

* * * * *